United States Patent [19]

Rubin

[11] Patent Number: 4,517,734
[45] Date of Patent: May 21, 1985

[54] METHOD OF PASSIVATING ALUMINUM INTERCONNECTS OF NON-HERMETICALLY SEALED INTEGRATED CIRCUIT SEMICONDUCTOR DEVICES

[75] Inventor: Jacob D. Rubin, Rochester, N.Y.

[73] Assignee: Eastman Kodak Company, Rochester, N.Y.

[21] Appl. No.: 525,266

[22] Filed: Aug. 22, 1983

Related U.S. Application Data

[63] Continuation-in-part of Ser. No. 377,288, May 12, 1982, abandoned.

[51] Int. Cl.³ .............. H01L 21/88; H01L 21/92; H01L 21/94; H01L 21/56
[52] U.S. Cl. .............. 29/577 C; 29/588; 29/589; 148/6.27; 427/88
[58] Field of Search .............. 148/6.27; 427/88, 343; 29/577, 577 C, 588, 589

[56] References Cited

U.S. PATENT DOCUMENTS

| | | | |
|---|---|---|---|
| 3,247,428 | 4/1966 | Perri et al. | 317/234 |
| 3,681,147 | 8/1972 | Dhaka et al. | 148/1.5 |
| 3,935,083 | 1/1976 | Tomozawa et al. | 204/38 A |
| 3,986,897 | 10/1976 | McMillan et al. | 148/6.27 |
| 4,089,709 | 5/1978 | Harris | 148/6.27 |

OTHER PUBLICATIONS

"Application of Aluminum Oxide to Integrated Circuits Fabrication", by Harada et al., IEEE Transactions on Reliability, vol. R-25, No. 5, Dec. 1976.

*Primary Examiner*—Brian E. Hearn
*Assistant Examiner*—Alan E. Schiavelli
*Attorney, Agent, or Firm*—Dennis P. Monteith

[57] ABSTRACT

Aluminum metal runs and bonding pads on an integrated circuit die are passivated, subsequent to wire bonding of the circuit die to a lead frame, by immersing the lead frame and wire-bonded die in hot deionized water for approximately 60 minutes.

3 Claims, No Drawings

METHOD OF PASSIVATING ALUMINUM INTERCONNECTS OF NON-HERMETICALLY SEALED INTEGRATED CIRCUIT SEMICONDUCTOR DEVICES

This application is a continuation-in-part of application Ser. No. 377,288, filed May 12, 1982, now abandoned in the name of Jacob David Rubin.

BACKGROUND OF THE INVENTION

1. Field of the Invention

The present invention relates in general to an integrated circuit manufacturing process. More particularly, the invention relates to an improved method for passivating aluminum connections to various semiconductor regions of an integrated circuit die.

2. Description Relative to the Prior Art

Aluminum contacts, which are deposited in openings of a silicon dioxide layer covering an underlying integrated circuit die, and aluminum metal runs, which are connected to respective contacts and are adherent to the top surface of the oxide layer, have been passivated in the prior art by a number of techniques. In one such technique, described in an article entitled "Application of Aluminum Oxide to Integrated Circuits Fabrication"; IEEE Transactions on Reliability; Volume R-25 No. 5; December 1976; semiconductor wafers were processed by a standard sequence of processing steps except that the wafers were also immersed in boiling deionized water after patterning of the aluminum metal runs. The heater water converts the exposed surface of the aluminum to aluminum oxide during this processing step. The aluminum oxide protects or passivates the aluminum which reduces the frequency of open circuit failures due to corrosion of the aluminum. After immersing the die in the boiling water, a standard thin film of passivating glass, such as phosphosilicate glass or borosilicate glass, is deposited over the oxidized aluminum runs and insulating layer covering the die to further protect the integrated circuit. The glass film and then the aluminum oxide were etched to expose wire bonding pads, e.g. ends of the aluminum runs normally located near edges of the die. The otherwise standard process was completed by wire bonding the contact pads to a lead frame and then encapsulating the die in an epoxy resin.

The glass film inevitably contains some defects such as pinholes, discontinuous coverage, or cracks. A disadvantage of this process is that when aluminum oxide is etched from the aluminum to expose the wire bonding pads, aluminum oxide exposed by defects in the glass may also be etched thereby exposing aluminum which otherwise should be passivated. Moisture can attack this aluminum as well as the exposed aluminum on the bonding pads. Also, ingredients contained in the epoxy resin may attack the bonding pads and the aluminum exposed by glass defects from which aluminum oxide has been etched. The moisture and/or resin can corrode the exposed aluminum to an extent that open circuit failures occur.

SUMMARY OF THE INVENTION

In view of the foregoing, an object of the invention is to overcome the aforementioned problem of incomplete passivating of the aluminum on an integrated circuit die, and thereby significantly reduce aluminum corrosion, without requiring complex wafer processing. An integrated circuit die with an aluminum metallization pattern covered by a layer of passivating glass is formed by standard processing of a semiconductor wafer. The aforementioned object is achieved by wire bonding the die to a lead frame, then immersing the die, including at least the bonding wires and preferably also including the lead frame, in heated deionized water to passivate exposed aluminum with aluminum oxide. Because wire bonding occurs prior to the oxidizing of the aluminum, an aluminum oxide etching step is not required, as is performed in the prior art IC manufacturing process described in the aforementioned IEEE publication. As the etching of oxide protecting the aluminum is not required, overall wafer processing is simplified. Furthermore, aluminum exposed by defects in the passivating layer of glass and exposed aluminum on the bonding pads are passivated by the subsequent immersion of the die in the heated deionized water, thereby more completely protecting the aluminum from corroding.

In a preferred embodiment of the invention, a process of manufacturing a semiconductor device includes depositing aluminum on a surface of the semiconductor device to form an electrically conductive interconnect pattern for an integrated circuit formed within the body of a semiconductor material, depositing a glass passivating layer over the interconnect pattern and removing portions of the glass layer to expose bonding pads of the interconnect pattern, bonding wires to the pads to provide electrical access to the interconnect pattern, and immersing the die including the bonded wires in hot deionized water.

The invention and its features and advantages will become more apparent in the detailed description of a preferred embodiment presented below.

DETAILED DESCRIPTION OF A PREFERRED EMBODIMENT

Because manufacturing processes for integrated circuit (IC) semiconductor devices are well known, the present description will be directed in particular to steps forming part of or cooperating directly with, the passivating method in accordance with the present invention. It is to be understood that IC manufacturing steps not specifically described may take various forms well known to those having skill in the semiconductor art.

Typically, an IC is formed in a circular wafer of silicon by growing an epitaxial n-type conductivity layer on the wafer. By standard masking and diffusion techniques, a plurality of p-type and n-type conductivity regions are formed in the epitaxial layer for defining a plurality of semiconductor devices within individual die in the wafer. N+ regions are then diffused into the epitaxial layer and other n-type regions over which aluminum contacts are to be formed. An insulating layer of silicon dioxide is then thermally grown on the top surface of the wafer so as to cover all of the foregoing regions. Appropriate openings or windows are then formed in the silicon dioxide to expose the n+ regions and p-type regions to which electrical contacts are to be made. Aluminum is deposited both within the windows and over the insulating layer for making respectively electrical contacts to and metal runs interconnecting the semiconductor devices formed within the epitaxial layer.

A convenient and highly accurate way to form openings in the silicon dioxide is to use photoengraving techniques. A photoengraving resist is placed over the silicon dioxide surface, and then is exposed through a master photographic mask having opaque areas corresponding to the areas from which the oxide is to be removed. In the usual photographic developing, the unexposed resist is removed. Chemical etching is then employed to remove the oxide layer from the unexposed areas while the exposed and developed resist serves as a mask to prevent chemical etching of the silicon dioxide areas that are to be left on the semiconductor surface.

Various methods may be employed for forming the contacts to the underlying IC and for forming the aluminum metal runs. By way of example, a layer of aluminum may be deposited by vacuum evaporation of aluminum over the entire upper surface of the semiconductor device. Unwanted metal is then removed by known photoengraving techniques to leave only the contacts and metal runs. The aluminum used for the metallization pattern can, in accordance with usage in the semiconductor industry, be substantially pure aluminum or, can include 1.5% additions of silicon and/or copper.

Heretofore, to provide a satisfactory yield, the prior art, as exemplified by the aforementioned IEEE article, immersed the wafers in boiling deionized water after aluminum patterning to passivate the aluminum contacts and runs. Then the wafers are covered with a passivating layer of glass such as phosphosilicate glass, borosilicate glass or silicon nitride. U.S. Pat. No. 3,247,428 discloses a method for applying a thin film of borosilicate glass to an IC.

Windows are etched in the passivating glass to expose wire bonding pads, which normally are ends of the aluminum runs that terminate near edges of individual wafer die. This requires both an etchant to remove the glass, and an etchant to remove the oxide from the aluminum. The wafer is then cut into a plurality of integrated circuit die and the individual die are wire bonded to lead frames. After the die are wire bonded, they are encapsulated in an epoxy resin, which further protects the die from environmental contaminants.

As described in the portion of this disclosure relating to the prior art, because the glass layer on top of the IC die inevitably contains some defects, such as pinholes, discontinuous coverage, or cracks, aluminum oxide exposed by these glass defects may be removed when aluminum oxide is etched to expose wire bonding pads. Thus, portions of the aluminum metal runs may be exposed and can corrode when exposed to environmental and process contaminants, thereby resulting in open circuit failure of the IC.

I have now discovered that integrated circuit devices with improved resistance to corrosion are produced by the immersing of the die in heated deionized water after the bonding of wires to the aluminum metal runs. It is an important difference from the prior art that the method of the present invention uses no hot water aluminum passivation step prior to the depositing of the glass passivating layer and the wire bonding of the die. Using a hot water step for aluminum passivation subsequent to wire bonding permits standard semiconductor manufacturing processing using a conventional wire bonding technique while not detrimentally affecting device yield.

In carrying out the aluminum passivating method of the present invention, a thin layer of glass is deposited on the wafer immediately after the patterning of the aluminum metal runs. After the glass layer is etched to expose the wire bonding pads, the wafer is cut into a plurality of IC die. Then wires, peferably made of aluminum, are bonded to the metal runs and a lead frame. The wire-bonded circuit die and preferably also including the lead frame are loaded on a lead frame carrier which was cleaned by an aluminum etch. The carrier is then immersed in hot deionized water, heated between at least 95° C. up to boiling, for approximately 60 minutes. The heated water causes oxidation of any exposed aluminum including the bonding pads, aluminum exposed by defects in the glass passivating layer, and the bonded wires if they are aluminum. The aluminum oxide ($Al_2O_3$) improves the ability of the underlying aluminum to resist contaminants such as moisture and epoxy resin, which is used to encapsulate the IC die and bonding wire in a plastic package.

The deionized water should be free of contaminants, otherwise a uniform passivating layer of $Al_2O_3$ cannot be formed and/or the contaminants such as sodium, may penetrate the protective layer of silicon dioxide and cause short circuiting of the IC. After hot water immersion, the carrier may be dipped briefly in alcohol to promote drying.

After subjecting the wire-bonded integrated circuit die to the heated water, and preferably drying the die in the presence of alcohol, the die is encapsulated in a plastic package preferably consisting of the aforementioned epoxy resin.

Two lots of IC devices—one lot having 145 IC's and the other 156 IC's—were processed to passivate the aluminum on the IC's with $Al_2O_3$ in accordance with the invention. After a layer of aluminum was deposited on the IC's and was patterned to form the aluminum metal runs, a thin film of passivating glass was deposited on the IC's. The passivating glass was etched by chemicals well known in the art to expose wire bonding pads. After the wafers for each of the two lots were sliced into individual die, the IC's were wire bonded to lead frames. After wire bonding, the die of each lot were processed to form $Al_2O_3$ on their respective die bonding pads and bonding wires as follows:

Lot #1 including the lead frames was immersed in boiling deionized water for one hour.

Lot #2 and the lead frames were immersed in 98° C. deionized water for one hour.

A third lot of 164 IC devices, which were wire bonded to lead frames, was placed in an autoclave at a pressure of 15 psi for one hour. The autoclave was filled with steam at 120° C. to oxidize the exposed aluminum. Although it was known that the oxidation rate of the aluminum under these conditions would be much slower than the aluminum oxidation rate using the heated deionized water, these IC devices were processed in this manner to compare them to the IC devices of lots #1 and #2, to evaluate the effectiveness of passivating aluminum according to the invention.

A fourth lot of 152 wire-bonded IC devices was not subjected to $Al_2O_3$ growth and served as a control group.

After lots 1, 2 and 3 were passivated with $Al_2O_3$ as disclosed above, all IC devices were inspected. Compared to lot #4, lots #1 and #2 suffered no device yield loss from the additional hot water processing step. This is in contrast to the typical IC process where an additional process step often results in decreased device yield.

Each lot was then subjected to an accelerated life test under humid conditions by storing them in an autoclave at a temperature of 120° C. and a pressure of 15 psi for a total of 6.25 hours. Although it was known that this test would cause a high percentage of the devices in each of the 4 lots to fail or not to perform within design performance specifications, the test was made to evaluate the capability of the aluminum contacts and metal runs to withstand corrosion. The test results were as follows:

Lot #1—12 devices of a total of 145 devices (8.3 percent) had open circuit failures due to corrosion.

Lot #2—26 devices of a total of 156 devices (16.6 percent) had open circuit failures due to corrosion.

Lot #3—64 devices of a total of 164 devices (39 percent) had open circuit failures due to corrosion.

Lot #4—152 devices of a total of 188 devices (80.8 percent) had open circuit failures due to corrosion.

While the invention has been described in detail with reference to a preferred embodiment thereof, it will be understood that variations and modifications can be affected within the spirit and scope of the invention.

I claim:

1. In a process of manufacturing a semiconductor device including the steps of forming circuit elements in the body of a semiconductor substrate, depositing an aluminum layer on said circuit elements to form an interconnect pattern for an integrated circuit die, and bonding wires to said integrated circuit die to provide electrical access to said interconnect pattern, a method of passivating said aluminum layer comprising the step of immersing said wire-bonded integrated circuit die in deionized water heated to at least approximately 95° C.

2. A method as defined in claim 1 wherein said integrated circuit die is immersed in boiling deionized water up to approximately 60 minutes.

3. A method as defined in claim 2 wherein said integrated circuit die is dipped in alcohol subsequent to the boiling water step.

* * * * *